United States Patent [19]
Daniels

[11] 3,956,696
[45] May 11, 1976

[54] APPARATUS FOR MEASURING THE RESISTANCE OF AN INDUCTOR, HAVING TIME CONSTANT COMPENSATION

[75] Inventor: Michael G. Daniels, Muncie, Ind.

[73] Assignee: Westinghouse Electric Corporation, Pittsburgh, Pa.

[22] Filed: Apr. 17, 1975

[21] Appl. No.: 569,037

[52] U.S. Cl. ................................................. 324/62
[51] Int. Cl.² ........................................ G01R 27/02
[58] Field of Search ............................ 324/59, 62, 64

[56] References Cited
UNITED STATES PATENTS

| | | | |
|---|---|---|---|
| 2,772,395 | 11/1956 | Runaldue | 324/62 R |
| 3,207,980 | 9/1965 | Shockroo | 324/62 R |
| 3,210,657 | 10/1965 | Flanagan | 324/62 R |
| 3,445,764 | 5/1969 | Tedeschi | 324/59 |

*Primary Examiner*—Robert J. Corcoran
*Attorney, Agent, or Firm*—C. L. McHale

[57] ABSTRACT

Apparatus for measuring the DC resistance of large inductors. A series resistance is connected in series with the inductor and the combination is connected in parallel with a capacitor and a variable resistance. A DC potential is applied to the parallel network to produce a voltage drop across the series resistance, the variable resistance, and the inductor. These voltages are applied to a processing circuit which subtracts the variable resistance voltage from the inductor voltage and divides the difference voltage by the series resistance voltage. The resulting voltage is proportional to the internal resistance of the inductor and does not vary with time when the variable resistance is adjusted to make the time constant of the inductive branch equal to the time constant of the capacitive branch of the parallel network. A differentiation circuit is used to indicate when the variable resistance is set at the proper value to balance the time constants.

12 Claims, 2 Drawing Figures

APPARATUS FOR MEASURING THE RESISTANCE OF AN INDUCTOR, HAVING TIME CONSTANT COMPENSATION

BACKGROUND OF THE INVENTION

1. Field of the Invention

This invention relates, in general, to electrical measuring apparatus and, more specifically, to electrical apparatus for measuring the resistance of an inductor.

2. Description of the Prior Art

Since the DC resistance of a metallic conductor varies according to the temperature of the conductor, knowledge about the DC resistance provides an indication of the temperature of the conductor. In electrical apparatus, such as power transformers, knowledge about the temperature of the inductors or windings is often desirable during the design and testing of a new winding structure. Since accessibility to the interior of these windings is often inconvenient, the measurement of the DC resistance of the winding furnishes a convenient and reliable method for determining the temperature within the winding.

Conventional methods for measuring the DC resistance of large inductors use Kelvin or Wheatstone bridge procedures. However, using these methods is unsatisfactory for certain inductors due to the long time constant associated with inductors having a large inductance and a low resistance. In large power transformers, time constants greater than one hour have been encountered. Since the temperature measurements are usually desired at a particular time or after a certain period of operating time, delays in measuring the temperature related resistance detracts from the accuracy of the information desired when conventional methods are used. In addition, the actual time needed to make the measurements is undesirable since excessive waiting is involved for the measurements to stabilize.

In order to obtain a DC resistance measurement on a large inductor accurately, the time constant of the inductor should not influence the resistance readings. Therefore, it is desirable, and it is an object of this invention, to provide apparatus for measuring the DC resistance of large inductors, wherein the apparatus contains time constant compensating circuitry in order that the readings may be taken quickly and without the need to wait until the transient voltages in the inductor have decayed sufficiently.

SUMMARY OF THE INVENTION

There is disclosed herein new and useful apparatus for conveniently measuring the DC resistance of inductors by compensating for the time constant of the inductor. The apparatus includes a series resistance connected in series with the inductor, an adjustable resistance and capacitor network connected in parallel with the inductor and the series resistance, and a source of DC potential which may be connected across the parallel network. Voltages are obtained across the inductor, the series resistance, and the adjustable resistance for application to a processing circuit which processes these voltages and displays a voltage proportional to the DC resistance of the inductor. The processor instantaneously subtracts the voltage across the adjustable resistance from the voltage across the inductor. The difference voltage is then divided by the voltage across the series resistance to provide an output voltage which is proportional to the DC resistance of the inductor when the time constant in the inductive branch of the parallel network is equal to the time constant in the capacitive branch of the parallel network. A digital readout voltmeter is used to indicate the DC resistance. The time constant of the two branches are made equal by adjusting the adjustable resistance until the time varying voltage component detected by the voltmeter becomes zero. This is indicated conveniently by a differentiation circuit which is connected to the output voltage of the processing circuit and which differentiates this voltage to indicate when the voltage is constant. Due to the ability to compensate for the transient voltage, the resistance measurement may be made much quicker than by prior art techniques.

BRIEF DESCRIPTION OF THE DRAWING

Further advantages and uses of this invention will become more apparent when considered in view of the following detailed description and drawing, in which.

DESCRIPTION OF THE PREFERRED EMBODIMENTS

Figure 1:
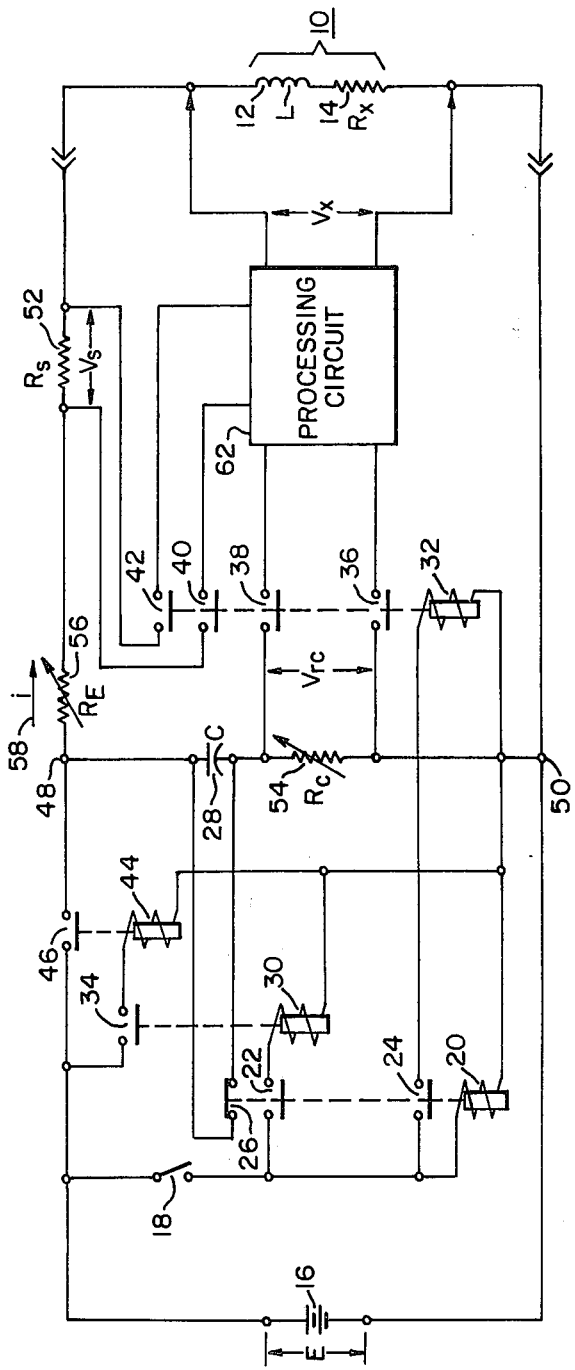
FIG. 1 is a schematic diagram of a time constant compensating measuring device constructed according to this invention.

Throughout the following description, similar reference characters refer to similar elements or members in all of the figures of the drawing.

Referring now to the drawing, and to FIG. 1 in particular, there is shown a schematic diagram of a resistance measuring device constructed according to this invention. The apparatus is illustrated in an arrangement for measuring the DC resistance of an inductor 10 which is represented by the lumped inductance element 12 and the lumped DC resistance element 14. It is the value of the resistance element 14, or $R_x$, which is desired to be found.

A battery 16 is illustrated in FIG. 1 as a source of DC potential. The potential E of the battery 16 is applied to the passive elements of the measuring apparatus when a series of switching operations has been performed. The switch 18 is closed to start the measurement of the resistance of the inductor 10. Closing the switch 18 energizes the relay 20 which closes the contacts 22 and 24 and opens the contacts 26. The contacts 26 are maintained in the normally closed position to assure that, prior to activation of the switch 18, there is negligible charge on the capacitor 28.

Closing the contacts 22 and 24 energizes the relays 30 and 32 which closes the contacts 34, 36, 38, 40 and 42. The contacts associated with the relay 32 are used for protective purposes to isolate the processing circuit 62 from voltage surges during the process of measuring the DC resistance of the inductor 10. For this same reason, as will be discussed in more detail hereinafter, the relay 30 has a time delay upon opening after de-energization.

The contacts 34 energize the relay 44 when they are closed. This energizes the contacts 46 which apply the DC potential from the battery 16 across the terminals 48 and 50 of the resistance measuring apparatus. When this happens, currents flow through the passive elements of the resistance measuring apparatus and voltage drops across these elements are produced. The voltages of significance in this description are the voltage $V_s$ across the series resistance 52, the voltage $V_x$ across the inductor 10 being measured, and the $V_{rc}$ across the adjustable resistance 54. The circuit is generally a parallel circuit or network comprising an inductive branch and a capacitive branch. The inductive branch includes the inductance element 12, the resistance element 14, and the resistance elements or resistors 52 and 56. The capacitive branch includes the capacitor 28 and the adjustable resistor 54. The current $i$, which flows in the direction indicated by the arrow 58, will be used in analyzing the function of the circuit elements.

When the voltage from the battery 16 is applied to the parallel circuit, the voltage across the resistor 54 is represented by the equation $$V_{rc} = Ee - t/R_cC$$

where t is the time after the potential has been applied. By combining the resistances in the inductive branch of the circuit according to the equation $$R' = R_E + R_s + R_x$$

the current through the inductive branch can be expressed as $$i = E/R' (1 - e^{-R't/L})$$

where $t$ is also the time after the potential has been applied to the parallel circuit.

The voltage across the inductor 10 may be represented by the equation $$V_x = L \, di/dt + R_x i$$

which, when substituting the equation for the current through the inductor, becomes $$V_x = L \, dE/dt R' (1 - e^{-R't/L}) + R_x E/R' (1 - e^{-R't/L})$$

When simplified, this becomes $$V_x = E e^{-R't/L} + R_x E/R' (1 - e^{-R't/L})$$

In order for the above equation to represent quantities which are useful in the measurement of the DC resistance of the inductor 10, it is desired that the equation $$1/R_cC = R'/L$$

exists. In other words, it is desirable for the time constant $R_cC$ of the capacitive branch to be equal to the time constant $L/R'$ of the inductive branch. That is, that the equation $$R_cC = L/R'$$

is established.

This is accomplished conveniently by adjusting the resistance of the adjustable resistor 54 to the value which makes the time constants equal. It is also within the scope of this invention that other components in the parallel circuit could be changed in value to provide the time constant equality. However, the ease with which a resistor can be varied is considered advantageous in adjusting the circuit components to provide the equality and is illustrated herein as a preferred embodiment of the invention.

When the time constants are equal, the voltage difference between the voltage across the inductor 10 and the voltage across the adjustable resistor 54 may be represented as $$V_x - V_{rc} = R_x E/R' (1 - e^{-R't/L})$$

Subtraction of the voltage across the adjustable resistor 54 from the voltage across the inductor 10 is performed by the processing circuit 62. The voltage across the series resistor 52 may be represented by $$V_s = R_s i = R_s E/R' (1 - e^{-R't/L})$$

By dividing the difference voltage by the voltage across the series resistor 52, a voltage is obtained according to the equation $$(V_x - V_{rc}/V_s) = R_x/R_s$$

It can be seen from this equation that the DC resistance $R_x$ of the inductor 10 can be obtained from a manipulation of the three measured voltages and by knowing the value of the series resistor 52. In actual practice, the series resistor 52 could be a resistor which has a resistance equal to some multiple of ten. The provides a convenient display of the unknown resistance $R_x$ in that the value of resistance displayed by the voltmeter connected to the processing circuit 62 is accurately indicated numerically and only a mental placement of the decimal point is necessary. To provide the greatest versatility of the apparatus disclosed herein, and to take advantage of the high accuracy of the readings obtained thereby, the series resistor 52 may be a standard resistor of highly accurate resistance.

The resistor 56 is included in the circuit shown in FIG. 1 for the purpose of limiting the current flow through the inductor 10 to a value which does not appreciably reduce the voltage of the battery 16. Various arc protecting elements, such as varistors, may be used across the relay contacts, such as the contacts 46, to prevent damage to the contacts upon the removal of the battery voltage from the parallel circuit. In addition, a similar voltage limiting element may be connected in parallel with the adjustable resistor 54 to limit the voltage $V_{rc}$ which is developed immediately after the contacts 46 are closed.

When the switch 18 is opened after the resistance measurements have been made, the contacts 34 of the timed delay relay 30 are opened after the contacts 36, 38, 40 and 42 of the relay 32 have removed the processing circuit 62 from the parallel network. Thus, any transient or surge voltages which are produced across the resistors 52 and 54 are not applied to the processing circuit 62.

Figure 2:
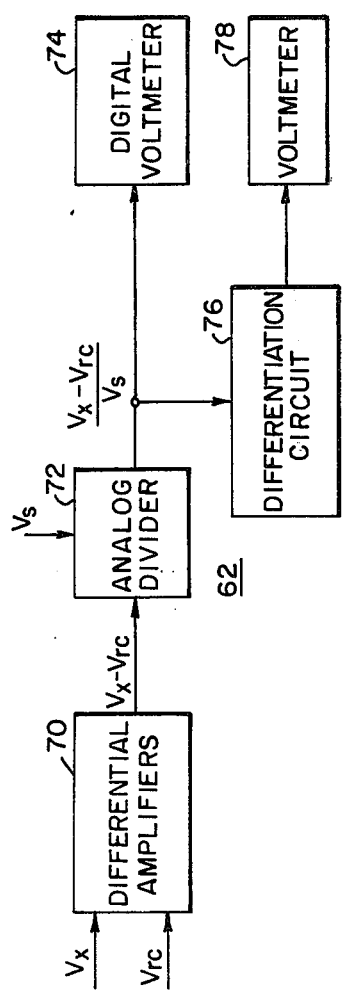
FIG. 2 is a block diagram of the processing circuit used in the device shown in FIG. 1.

FIG. 2 is a block diagram of the processing circuit 62 shown in FIG. 1. The voltages from the inductor and from the adjustable resistor are applied to a differential amplifier circuit 70 which consists of operational amplifiers suitably connected to provide an output voltage which is equal to the difference between the two input voltages. The voltage from the series resistor is applied to an analog divider circuit 72 along with the difference voltage from the differential circuit 70. The output from the analog divider circuit 72 is equal to the difference voltage divided by the voltage across the series resistor. This voltage is applied to the digital voltmeter 74 which provides an indication of the resistance of the inductor since the voltage applied to the digital voltmeter 74 is proportional to the inductor resistance when the circuit is properly adjusted.

The differentiation circuit 76 and the voltmeter 78 are used to determine when the circuit is properly adjusted so that the reading on the digital voltmeter 74 represents the DC resistance of the inductor 10 accurately. When the resistance measuring circuit is properly adjusted for equal time constants, the voltage indicated by the digital voltmeter 74 does not vary with time. Therefore, the output voltage from the differential circuit 76 is zero when the circuit is properly adjusted since the mathematical differential of a constant is zero. Conventional circuit components and arrangements may be used to provide the circuits 70, 72 and 76 and the internal components and connections of these circuits are known to those skilled in the art.

In making a resistance measurement of a large inductor, such as a winding of a power transformer, the circuit shown in FIG. 1 is connected to the inductor by connections which conduct current through the inductor and by connections which measure the voltage drop across the inductor. Switch 18 is then closed to apply the voltage from the battery 16 to the parallel circuit which includes the inductor 10. If the resistor 54 is adjusted properly, the voltmeter 78 indicates a zero voltage being produced by the differentiation circuit 76. If a zero voltage is not produced, switch 18 is opened, resistor 54 is readjusted, and switch 18 is closed again. This procedure is repeated until the voltage indicated by the voltmeter 78 remains zero after the switch 18 is closed. Electrically, this makes the time constant of the capacitive branch equal to the time constant of the inductive branch of the circuit shown in FIG. 1. When this occurs, the person performing the measurement knows that the voltage indicated by the digital voltmeter 74 is not varying with time and is an accurate reading of the internal resistance of the inductor. Thus, by using the apparatus disclosed herein, resistance measurements can be made quickly even when the measured inductor or winding has a long time constant. Consequently, temperature measurements can be made more conveniently and more accurately in a shorter period of time.

Since numerous changes may be made in the above described apparatus, and since different embodiments of the invention may be made without departing from the spirit thereof, it is intended that all of the matter contained in the foregoing description, or shown in the accompanying drawing, shall be interpreted as illustrative rather than limiting.

I claim as my invention:

1. Electrical apparatus for measuring the resistance of an inductor, comprising:

a first circuit branch having at least a first resistance element connected in series with the inductor being measured;

a second circuit branch having a second resistance element and a capacitance element, said first branch being connected in parallel circuit relationship with said second branch to form a parallel network;

means for applying a voltage to the parallel network which causes current flow through the first and second resistance elements and through the inductor;

means for subtracting the voltage across the second resistance element from the voltage across the inductor to provide a first voltage value;

means for dividing the first voltage value by the voltage across the first resistance element to provide a second voltage value; and means for measuring the second voltage value.

2. The electrical apparatus of claim 1 including means for adjusting the time constant of at least one branch so that the time constants of both branches are equal.

3. The electrical apparatus of claim 1 including means for indicating when the second voltage value is proportional to the resistance of the inductor.

4. The electrical apparatus of claim 3 wherein the indicating means comprises a differentiation circuit which is driven by the second voltage value, said differentiation circuit providing an indication of when the second voltage value is not changing in relation to time.

5. The electrical apparatus of claim 1 wherein the second resistance element and said capacitance element are connected in series circuit relationship.

6. The electrical apparatus of claim 1 wherein the value of the second resistance element may be varied to make the second voltage value constant with respect to time.

7. The electrical apparatus of claim 6 wherein the second resistance may be set to a value which makes the time constant of the first branch equal to the time constant of the second branch, said equality being necessary to make the second voltage value constant with respect to time.

8. The electrical apparatus of claim 1 wherein the means for applying a voltage to the parallel network comprises a source of DC potential and switch contacts which are closed to apply the DC potential to the parallel network.

9. The electrical apparatus of claim 8 including means for maintaining a zero charge on the capacitance element until the DC potential is applied to the parallel network.

10. The electrical apparatus of claim 1 including a time delay device which causes the subtracting and dividing means to be disconnected from the parallel network before the applied voltage is removed from the parallel network.

11. The electrical apparatus of claim 1 wherein the subtracting means comprises differential amplifiers.

12. The electrical apparatus of claim 1 wherein the dividing means comprises an analog divider circuit.

* * * * *